United States Patent
Lee (10) Patent No.: US 7,190,632 B2
(45) Date of Patent: Mar. 13, 2007

(54) SEMICONDUCTOR MEMORY DEVICE HAVING IMPROVED COLUMN SELECTION LINES AND METHOD OF DRIVING THE SAME

(75) Inventor: Seung-Hoon Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/452,780

(22) Filed: Jun. 14, 2006

(65) Prior Publication Data

US 2007/0002674 A1    Jan. 4, 2007

(30) Foreign Application Priority Data

Jul. 2, 2005    (KR)    ............... 10-2005-0059480

(51) Int. Cl.
*G11C 8/00*    (2006.01)
*G11C 5/06*    (2006.01)

(52) U.S. Cl. .............. 365/233; 365/230.06; 365/63

(58) Field of Classification Search ........... 365/200, 365/202, 203, 220, 230, 233, 194
See application file for complete search history.

(56) References Cited

U.S. PATENT DOCUMENTS

| | | | | |
|---|---|---|---|---|
| 5,822,268 A | * | 10/1998 | Kirihata | 365/230.03 |
| 5,896,340 A | * | 4/1999 | Wong et al. | 365/230.03 |
| 5,949,732 A | * | 9/1999 | Kirihata | 365/230.03 |
| 6,463,007 B2 | * | 10/2002 | Ohtake et al. | 365/233 |
| 6,646,946 B2 | * | 11/2003 | Tomishima et al. | 365/230.03 |
| 2004/0017700 A1 | * | 1/2004 | Demone | 365/200 |
| 2004/0202029 A1 | * | 10/2004 | Kim et al. | 365/191 |
| 2004/0246812 A1 | * | 12/2004 | Bhavnagarwala et al. | 365/233 |
| 2005/0141333 A1 | * | 6/2005 | Fujisawa | 365/233 |

FOREIGN PATENT DOCUMENTS

JP    11-250664    * 9/1999

* cited by examiner

*Primary Examiner*—Tarifur Chowdhury
*Assistant Examiner*—Paul E Patton
(74) *Attorney, Agent, or Firm*—F. Chau & Associates, LLC (57) ABSTRACT

A semiconductor memory device includes first and second global column selection lines via which first and second global column selection signals are respectively transmitted to select a column of a memory cell array, wherein the first and second global column selection signals are out of phase with each other and have a first frequency lower than a reference clock signal frequency; a pair of column selection gates connected to a pair of bit lines and a pair of input/output (I/O) lines, wherein gate terminals of the column selection gates are connected to different local column selection lines; and a logic operation unit performing a logic operation on the first and second global column selection signals and outputting a local column selection signal having a second frequency higher than the first frequency. The local column selection signal is applied to the gate terminals of the column selection gates via the local column selection lines.

18 Claims, 5 Drawing Sheets

SEMICONDUCTOR MEMORY DEVICE HAVING IMPROVED COLUMN SELECTION LINES AND METHOD OF DRIVING THE SAME

CROSS-REFERENCE TO RELATED PATENT APPLICATIONS

This application claims priority to Korean Patent Application No. 2005-0059480, filed on Jul. 2, 2005, in the Korean Intellectual Property Office, the disclosure of which is incorporated by reference herein.

BACKGROUND OF THE INVENTION

1. Field of the Invention

The present invention relates to a semiconductor memory device and a method of driving the same, and more particularly, to a semiconductor memory device with hierarchical column selection lines, and a method of driving the same.

2. Description of the Related Art

A semiconductor memory device, and in particular, a synchronous dynamic random access memory (SDRAM) performing high-frequency operations, performs various commands in synchronization with a reference clock signal. Read/write characteristics are significant factors that determine the performance of the SDRAM. For instance, in the case of an SDRAM operating in response to a high frequency clock signal, e.g. 100 Mhz, the margin for enabling and disabling column line signals is significantly reduced.

Figure 1:
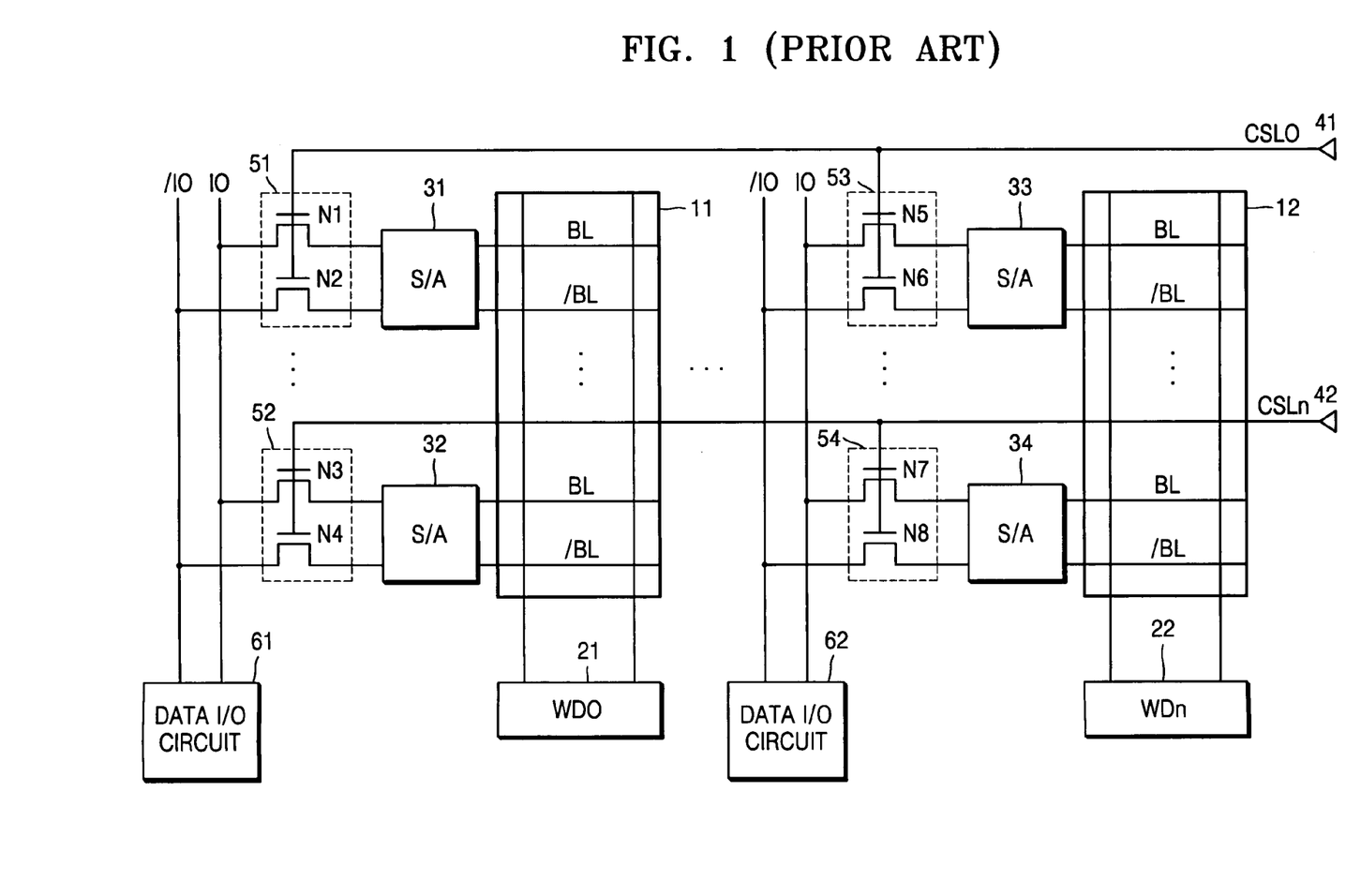
FIG. 1 is a block diagram illustrating a part of a conventional semiconductor memory device.

FIG. 1 is a block diagram illustrating a part of a conventional semiconductor memory device. Referring to FIG. 1, the conventional semiconductor memory device includes memory cell arrays. The individual memory cells are comprised of a plurality of rows and columns arranged in the form of a matrix. A semiconductor memory device may be composed of at least one memory cell array as illustrated in FIG. 1. FIG. 1 illustrates a first memory cell array 11 and an $n^{th}$ memory cell array 12. Word line driving units 21 and 22, that drive word lines of memory cell arrays, are respectively connected to the first and $n^{th}$ memory cell arrays 11 and 12.

Each of the first and $n^{th}$ memory cell arrays 11 and 12 is connected to sense amplifiers that amplify the difference in voltage between a bit line (BL) and a complementary bit line (/BL) pair to perform a read operation. Referring to FIG. 1, sense amplifiers 31 and 32 are respectively connected to a BL and pair of the first memory cell array 11, and sense amplifiers 33 and 34 are respectively connected to a BL and pair of the $n^{th}$ memory cell array 12.

The conventional semiconductor memory device of FIG. 1 includes column selection line driving units 41 and 42 that respectively generate column selection signals transmitted via column selection lines CSL0 and CSL1. The conventional semiconductor memory device further includes, pairs of column selection gates 51 through 54. Each column selection gate pair is switched on or off to electrically connect or disconnect the corresponding BL and pair to a pair of input/output (I/O) lines IO and /IO, in response to the column selection signals. US Patent Publication No. US2004-202029 discloses column selection lines of a semiconductor memory device and a method of driving the same. The IO and /IO lines are respectively connected to data I/O circuits 61 and 62.

Each of the column selection gate pairs 51 through 54 is comprised of switching devices. FIG. 1 illustrates two NMOS transistors, N1 and N2 as an exemplary embodiment of the switching devices. N1 is connected between the IO line and the BL. N2 is connected between the /IO line and the . A column selection signal is generated by the column selection line driving unit 41 to enable or disable the column selection gate pair 51. The signal is transmitted to the gate electrodes of the NMOS transistors N1 and N2 via the column selection line CSL0, thereby controlling the switching on and off of the NMOS transistors N1 and N2.

The column selection lines CSL0 and CSLn are often metal lines having a large capacitance. The column line signals transmitted via the column selection lines CSL0 and CSLn must toggle twice, from a logic low level to a logic high level and vice versa, during a cycle of a predetermined reference clock signal. When the column selection signal is toggled to the logic high level, the column selection gate pair 51 is turned on to electrically connect the BL, /BL, IO line, and /IO line to receive or output data. Next, when the column selection signal is toggled to the logic low level to turn off the BL, /BL, IO line, and /IO line, a predetermined precharge circuit (not shown) pre-charges the BL and /BL to a predetermined level.

As semiconductor memory devices have been developed to operate at high speeds, the speed of toggling the column selection signal must be improved so that the column selection signal can be toggled twice during a cycle of a predetermined high-frequency reference clock signal. However, a load on the column selection lines CSL0 and CSLn is increased due to the capacitance of the column selection lines CSL0 and CSLn via which the column selection signals are transmitted.

In addition, the higher the capacity of a semiconductor memory device, the greater the size and number of the memory cell arrays. As illustrated in FIG. 1, the load on the column selection lines CSL0 and CSLn via which the column selection signal is transmitted to each memory cell array, is also increased. Accordingly, there is a limitation to increasing the speed of toggling the column selection signal, thereby causing problems which will be described below with reference to FIG. 2.

Figure 2:
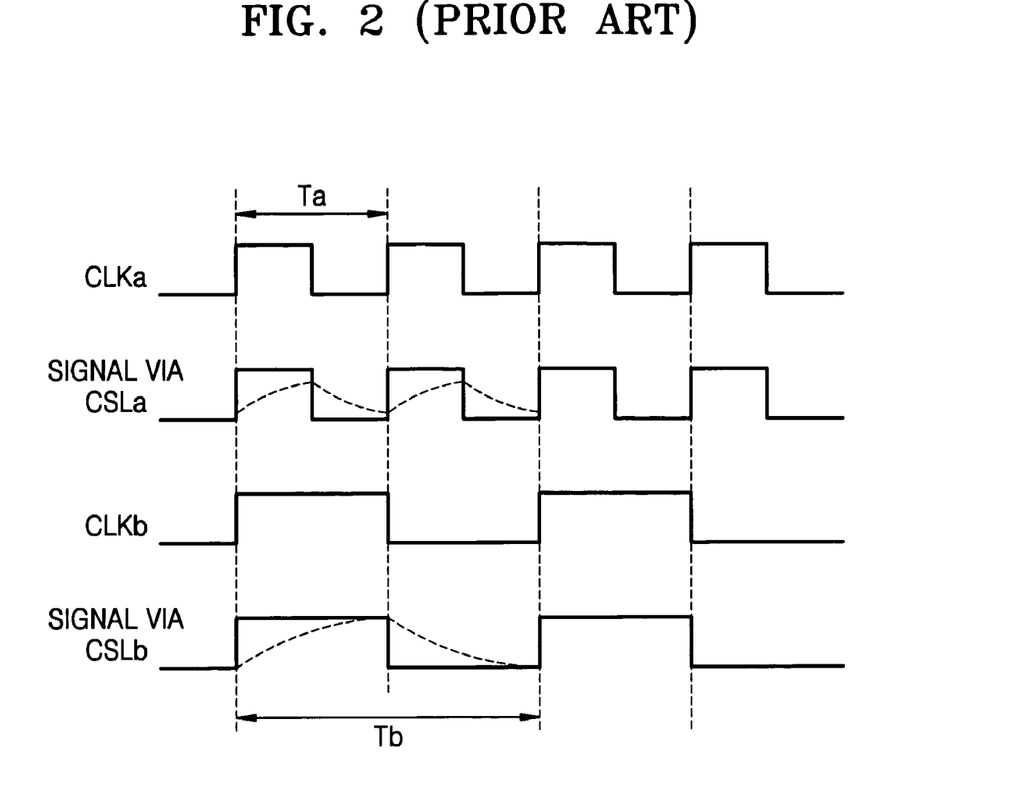
FIG. 2 is a waveform diagram illustrating the state of a column selection signal toggled according to the frequency of an operating clock signal.

FIG. 2 is a waveform diagram illustrating the state of a column selection signal toggled according to the frequency of an operating clock signal. FIG. 2 illustrates the waveforms of a high-frequency operating clock signal CLKa and a low-frequency operating clock signal CLKb, and column selection signals transmitted via column selection lines.

When data is input or output in response to the high-frequency operating clock signal CLKa having a cycle of Ta, a column selection signal CLSa transmitted via a column selection line has a waveform shape indicated by a dotted line. However, the column selection signal CLSa transmitted via a column selection line is not toggled enough to reach a logic high level or a logic low level during half the cycle of Ta, since the toggling speed of the column selection signal is low. Thus, data output from a pair of bit lines is not completely transmitted to a pair of I/O lines, thereby degrading the high-speed performance of a semiconductor memory device.

In contrast, when data is input or output in response to the low-frequency operating clock signal CLKb having a cycle of Tb, the column selection signal is sufficiently toggled to a logic high level or a logic low level for half the cycle of Tb even when the column selection signal CLSb is transmitted via a column selection line on which a load is applied, thereby enabling the semiconductor memory device to stably operate.

A column selection signal transmitted via a column selection line must toggle twice during an operating clock signal cycle. Due to this fact, the frequency characteristics of the column selection line have a greater influence on the column selection signal than data signals transmitted across a pair of I/O lines. Reducing the load on the column selection line improves the frequency characteristics. However, the load on the column selection line is determined by the metal line of the column selection line CSL, the structures within the column selection gate pairs, and process conditions. Once the structure within the column selection gate pairs and the process conditions are determined, the load on the column selection line is fixed, thereby making the semiconductor memory device difficult to operate at high speeds.

SUMMARY OF THE INVENTION

According to an exemplary embodiment of the present invention, there is provided a semiconductor memory device which includes a memory cell array, a first global column selection line, a second global column selection line, a column selection gate pair, and a logic operation unit. The memory cell array includes a bit line and a complimentary bit line pair. The semiconductor memory device receives and outputs data in synchronization with a reference clock signal. The first and second global column selection lines, transmit first and second global column selection signals to select a column of the memory cell array. The first and second global column selection signals have a frequency lower than a reference clock signal and are out of phase with each other by a predetermined angle. The column selection gate pair is connected between the pair of bit lines and a pair of input/output lines. The gate terminals of the column selection gate pair are connected to a local column selection line. The logic operation unit performs a logic operation on the column selection signals input from the global column selection lines. The logic operation unit outputs a local column selection signal with a frequency higher than the global column selection signals. The local column selection signal is transmitted across the local column selection line and is applied to the gate terminals of the column selection gate pair.

The logic operation unit may include an exclusive NOR gate performing an exclusive NOR operation on the first global and second global column selection signals.

The semiconductor memory device may further include a column selection line driver connected to the first and second global column selection lines, the column selection line driver generating the first and second global column selection signals.

A difference in phase between the first and second global column selection signals may be half a cycle of the reference clock signal.

According to exemplary embodiment of the present invention, there is provided a semiconductor memory device which has at least one memory cell array, a plurality of global column selection lines, and a column selection unit. The semiconductor memory device receives and outputs data in synchronization with a reference clock signal. The plurality of global column selection lines respectively transmit a plurality of global column selection signals to select a column of the memory cell array. The global column selection signals having a first frequency lower than the reference clock signal frequency and are out of phase with one another by a predetermined angle. The column selection unit is connected between a pair of bit lines and a pair of input/output lines. The column selection unit controls transmission of data between the bit lines and the input/output lines in response to the global column selection signals at a second frequency higher than the first frequency.

The column selection unit may control transmission of data between the bit lines and the input/output lines according to an exclusive NOR operation performed on the first and second global column selection signals.

According to exemplary embodiment of the present invention, there is provided a method of driving a semiconductor memory device which has at least one memory cell array and receives and outputs data in response to a reference clock signal, the method comprising respectively transmitting global column selection signals via a plurality of global column selection lines to select a column of the memory cell array, the global column selection signals having a first frequency lower than a reference clock signal frequency and are out of phase with one another by a predetermined angle; receiving the global column selection signals and performing a logic operation on the global column selection signals; outputting a local column selection signal to a pair of column selection gates, the local column selection signal generated by performing the logic operation on the global column selection signals, the local column selection signal having a second frequency higher than the first frequency; and controlling transmission of data between a pair of bit lines and a pair of input/output lines, in response to the local column selection signal.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail with reference to the accompanying drawings. Like reference numerals denote like elements throughout the drawings.

Figure 3:
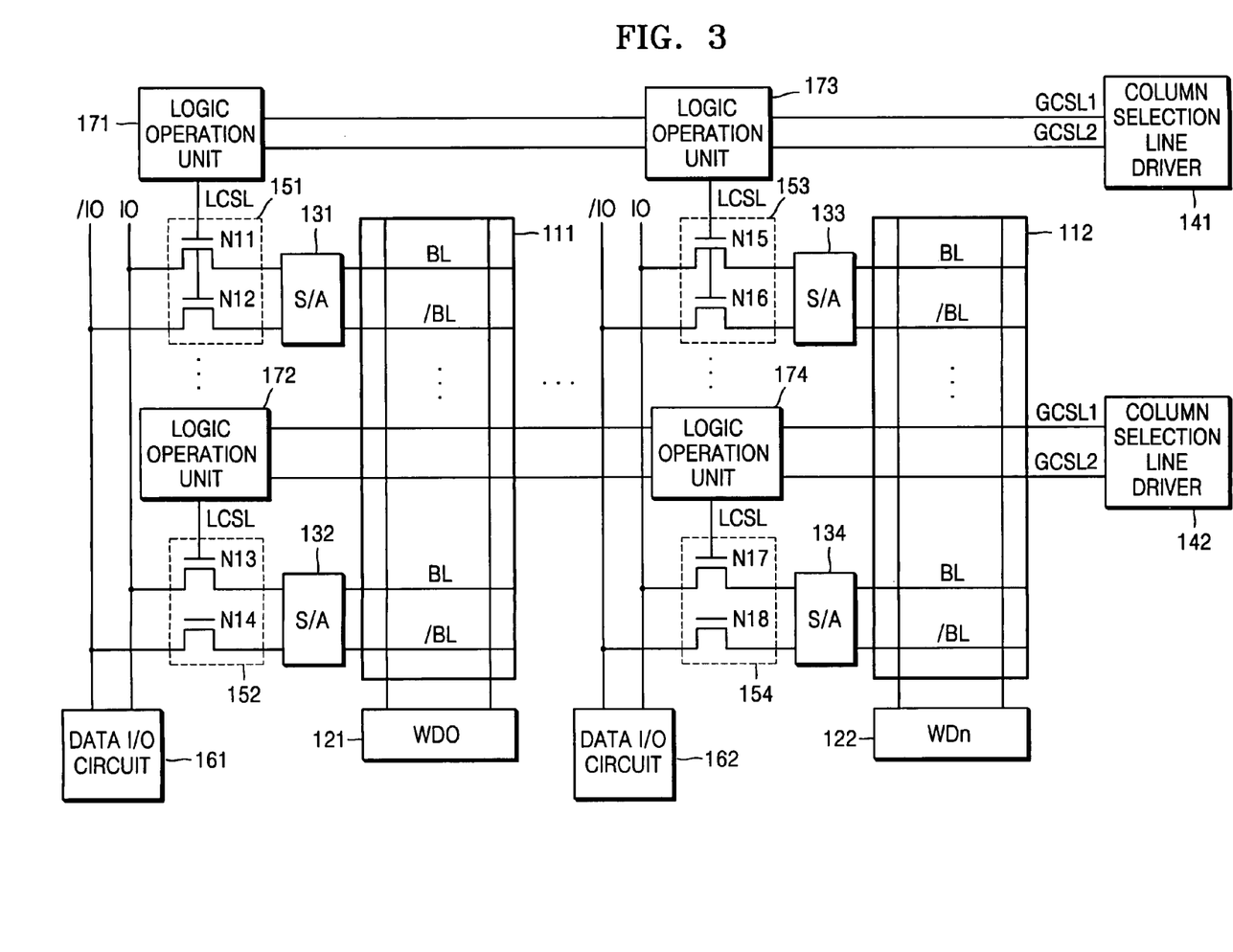
FIG. 3 is a block diagram illustrating a semiconductor memory device according to an exemplary embodiment of the present invention.

FIG. 3 is a block diagram illustrating a semiconductor memory device according to an exemplary embodiment of the present invention. Referring to FIG. 3, the semiconductor memory device includes memory cell arrays having a plurality of memory cells. In general, a semiconductor memory device has at least one memory cell array. FIG. 3 illustrates a first memory cell array 111 and an $n^{th}$ memory cell array 112. Word line driving units 121 and 122 drive word lines of memory cell arrays and are connected to the first memory cell array 111 and the $n^{th}$ memory cell array 112, respectively.

Each memory cell array is connected to a sense amplifier that amplifies the difference in voltage between a bit line (BL) and a complementary bit line (/BL) to perform a read operation. Referring to FIG. 3, sense amplifiers 131 and 132 are connected to a BL and pair of the first memory cell array 111, and the sense amplifiers 133 and 134 are connected to a BL and pair of the $n^{th}$ memory cell array 112.

In addition, the semiconductor memory device includes a plurality of global column selection line pairs arranged across a memory cell array to select a respective column of the memory cell array. In particular, FIG. 3 illustrates a first global column selection line GCSL1 and a second global column selection line GCSL2. The semiconductor memory device further includes column selection line driving units 141 and 142 that generate global column selection signals to be respectively transmitted via the first and second global column selection lines GCSL1 and GCSL2.

The semiconductor memory device further includes column selection gate pairs 151 through 154 connected between BL and pairs and pairs of input/output (I/O) lines IO and /IO. Each of the column selection gate pairs 151 through 154 is connected to a local column selection line (LCSL) that is arranged along a row of the memory cell array.

The column selection gate pairs 151 through 154 are switched on or off to electrically connect or disconnect a BL and pair to an IO and /IO line pair, thereby controlling input and output of data, in response to a predetermined control signal applied via the LCSL. In addition, the IO and /IO lines are connected to data I/O circuits 161 and 162, respectively.

The semiconductor memory device may include a plurality of global column selection line pairs to select one of a plurality of columns of the memory cell arrays 111 and 112. FIG. 3 illustrates a first global column selection line GCSL1 and a second global column selection line GCSL2.

A first global column selection signal and a second global column selection signal which are respectively transmitted via the first and second global column selection lines GCSL1 and GCSL2, have a first frequency that is lower than that of a reference clock signal in the semiconductor memory device. In particular, the first frequency may be half the reference clock signal frequency. The first global column selection signal is out of phase with the second global column selection signal by a predetermined angle.

The semiconductor memory device further includes logic operation units 171 through 174 that are electrically connected to the column selection gate pairs 151 through 154. The logic operation units receive the first and second global column selection signals that are out of phase with each other by the predetermined angle, and perform a logic operation thereon to output a local column selection signal having a second frequency. The second frequency is higher than the first frequency. The local column selection signal is input to the column selection gate pairs 151 through 154 via the LCSL.

A detailed description of the elements and operations of the semiconductor memory device of FIG. 3 that are the same as those of the conventional semiconductor memory device of FIG. 1, will not be repeated. For convenience of explanation, the semiconductor memory device will now be described with respect to the first memory cell block 111.

The column selection line driver 141 generates the first and second global column selection signals transmitted via the first and second global column selection lines GCSL1 and GCSL2, respectively. The first and second global column selection signals have a first frequency that is lower than that of the reference clock signal. The first frequency may be half that of the reference clock signal frequency.

If the first and second global column selection signals are transmitted across metal lines having a large load value, the first and second global column selection signals can be stably toggled to a logic high level or a logic low level. For instance, when the first frequency is half the reference clock signal frequency, the first and second global column selection signals are toggled to the logic low level or the logic high level only once during the reference clock signal cycle. Even if the semiconductor memory device operates in response to a high-frequency reference clock signal, the global column selection signals are stably toggled, thus preventing degradation of the performance of the semiconductor memory device.

Moreover, the frequencies of the first and second global column selection signals are equalized and the signals are adjusted to be out of phase with each other, so that the level of the local column selection signal obtained by performing a logic operation on the first and second global column selection signals is toggled between the logic high and low levels at predetermined intervals of time.

The first and second global column selection signals are input to an input terminal of the logic operation unit 171 via the first and second global column selection lines GCSL1 and GCSL2, respectively. The logic operation unit 171 performs a logic operation on the first and second global column selection signals to generate a local column selection signal having a second frequency. The logic operation unit outputs the local column selection signal to the column selection gate pair 151 via the LCSL. The column selection gate pair 151 may be comprised of switching devices. FIG. 3 illustrates NMOS transistors N11 and N12 as an exemplary embodiment of the switching devices.

The local column selection signal obtained by performing the logic operation on the first and second global column selection signals, has a second frequency that is higher than the frequency of the global column selection signals. The second frequency may be equal to that of the reference clock signal. A high-frequency local column selection signal is generated using low-frequency global column selection signals, and the column selection gate pair 151 is driven by the local column selection signal. If the frequency of the global column selection signals is half the frequency of the reference clock signal and the frequency of the local column selection signal is equal to that of the reference clock signal, the global column selection signals are toggled from a logic high level to a logic low level or vice versa during a reference clock signal cycle. In addition, the local column selection signal is enabled and disabled during a cycle of the reference clock signal, driving the column selection gate pair 151.

Hereinafter, a logic operation unit of the above semiconductor memory device will be described in greater detail.

Figure 4:
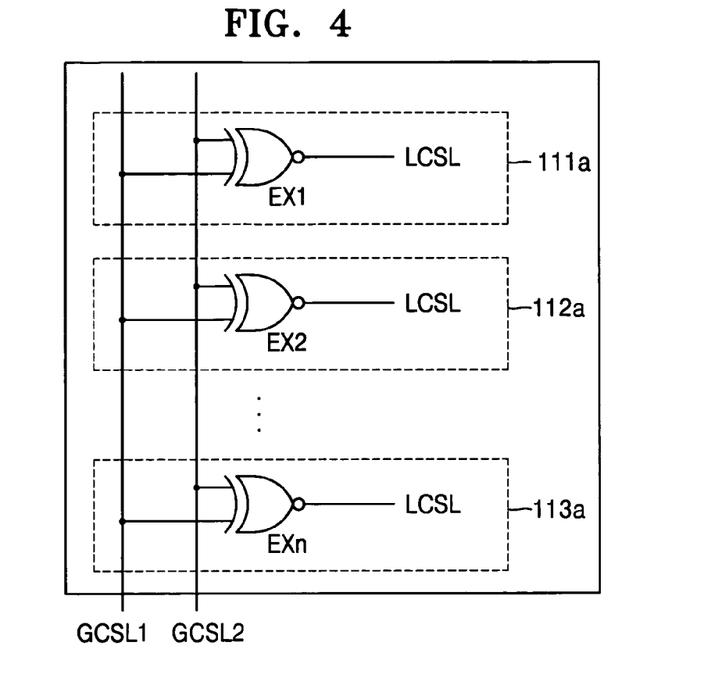
FIG. 4 illustrates an exemplary logic operation unit applied to the semiconductor memory device of FIG. 3 according to an exemplary embodiment of the present invention.

FIG. 4 illustrates an exemplary logic operation unit applied to the semiconductor memory device of FIG. 3 according to an exemplary embodiment of the present invention. FIG. 4 illustrates a first global column selection line GCSL1, a second global column selection line GCSL2, and exclusive NOR gates EX1 through EXn that perform a logic operation on a first and second global column selection signals. Reference numerals 111a, 112a, and 113a denote respective cell array blocks of a memory cell array.

As illustrated in FIG. 4, the exclusive NOR gates EX1 through EXn respectively receive the first and second column selection signals via the first and second global column selection lines GCSL1 and GCSL2, and perform an exclusive NOR operation thereon to generate a respective local column selection signal. The respective local column selection signal is applied to a respective column selection gate pair (not shown) of the cell array blocks 111a through 113a via a respective local column selection line (LCSL).

The first and second global column selection signals have a first frequency, and the local column selection signal has a second frequency. The first frequency is lower than the frequency of a reference clock signal generated in the semiconductor memory device. The first frequency may be half that of the reference clock signal frequency.

The first global column selection signal is out of phase with the second global column selection signal by half a cycle of the reference clock signal.

Figure 5:
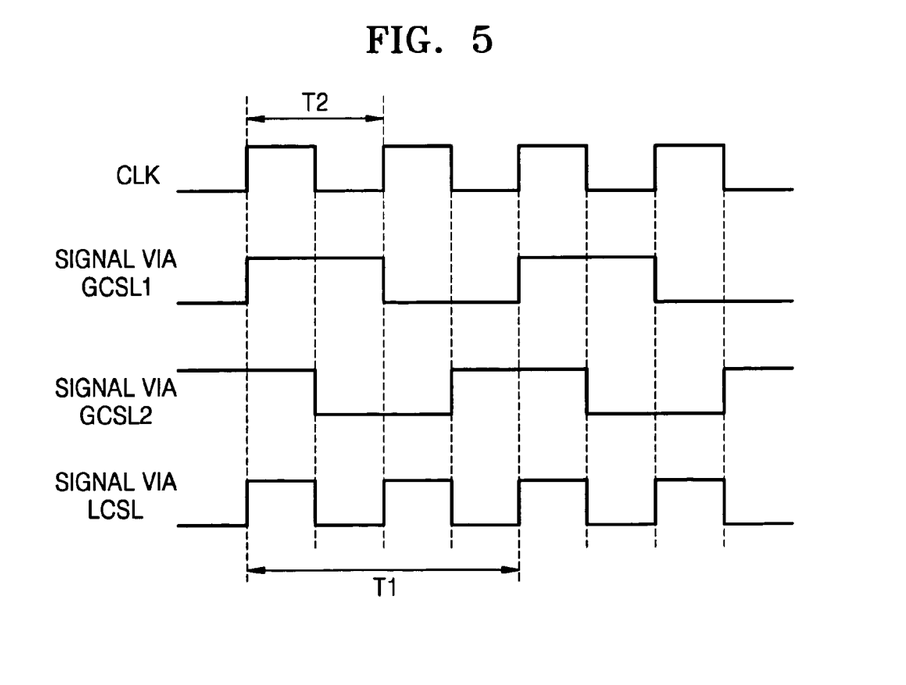
FIG. 5 is a waveform diagram illustrating the operating characteristics of the semiconductor memory device of FIG. 3 according to an exemplary embodiment of the present invention.

FIG. 5 is a waveform diagram illustrating the operating characteristics of the semiconductor memory device of FIG. 3 according to an exemplary embodiment of the present invention. In FIG. 5, reference numeral T1 denotes a cycle of a first and second global column selection signal, while T2 denotes, a cycle of a local column selection signal.

The first global column selection signal that is transmitted via a first global column selection line GCSL1 and precharged to a logic low level, is toggled to a logic high level. The second global column selection signal that is transmitted via a second global column selection line GCSL2 and precharged to a logic high level, is toggled to a logic low level. When both the first and second global column selection signals are at a logic high level or a logic low level, the local column selection signal obtained by performing an exclusive NOR operation thereon is at a logic high level. However, when the logic levels of the first and second global column selection signals are different from each other, the local column selection signal is at a logic low level.

As illustrated in FIG. 5, the local column selection signal has the same frequency as the reference clock signal CLK. Therefore, since the level of the local column selection signal is toggled twice during a reference clock signal cycle, a bit line and a complementary bit line of a data signal may be precharged during the reference clock signal cycle. In addition, the local column selection signal is generated by applying a global column selection signal whose frequency is lower than the reference clock signal frequency via the global column selection line. Therefore, it is possible to prevent degradation of the performance of the semiconductor memory device, caused by a load on the global column selection line, when the semiconductor memory device operates at high speeds in response to a high-frequency signal global column selection.

Although an exemplary embodiment of the present invention is described regarding the NOR gates EX1 through EXn with reference to FIG. 4, the invention is not limited to the NOR gates EX1 through EXn. Alternatively, the local column selection signal illustrated in FIG. 5 may be obtained by using OR gates as logic gates, and shifting a local column selection signal, which is obtained by performing an OR operation, by half a cycle of the reference clock signal CLK in the semiconductor memory device.

Alternatively, the global column selection lines may be formed of different metal layers. When the global column selection lines are densely arranged to increase the capacitance therein, the speed of toggling signals is limited. Therefore, the global column selection lines are formed of different metal layers to prevent the capacitance from increasing.

Figure 6:
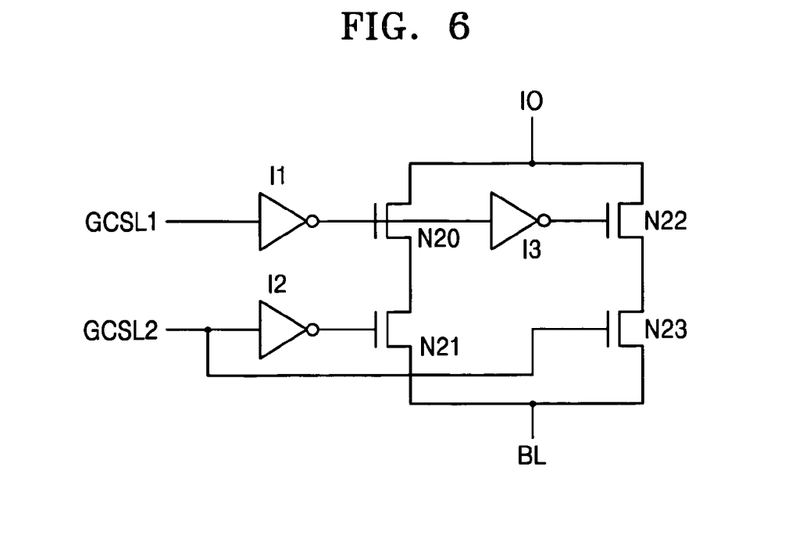
FIG. 6 is a circuit diagram illustrating an exemplary column selection unit applied to a semiconductor memory device according to an exemplary embodiment of the present invention.

FIG. 6 is a circuit diagram illustrating a column selection unit applied to a semiconductor memory device according to an exemplary embodiment of the present invention. The column selection unit is connected between a bit line (BL) and a I/O line (IO), and controls transmission of data between the BL and the IO line at a second frequency in response to a plurality of global column selection signal pairs having a first frequency, wherein the second frequency is higher than the first frequency.

Referring to FIG. 6, the column selection unit respectively receives a first and second global column selection signal via a first global column selection line GCSL1 and a second global column selection line GCSL2. Then, the column selection unit performs an exclusive NOR operation on the received first and second global column selection signals, and controls the transmission of data between the BL and the IO line according to the exclusive NOR operation result.

The first frequency may be half the frequency of a reference clock signal generated in the semiconductor memory device, and a difference in phase between the first and second global column selection signals may be half a cycle of the reference clock signal.

The column selection unit includes inverters I1 through I3 that invert an input signal, and transistors N20 through N23 that are switched on or off in response to predetermined signal inputs to gate terminals thereof.

When high-level global column selection signals are input via the first and second global column selection lines GCSL1 and GCSL2, the high-level global column selection signals are input to both gate terminals of the transistors N22 and N23 to turn on the transistors N22 and N23, thereby electrically connecting the IO line and the BL. If the first and second global column selection signals are at a logic low level, the transistors N20 and N21 are turned on to electrically connect the IO line and the BL.

In contrast, when one of the first and second global column selection signals is at a logic low level and the other is at a logic high level, one of the transistors N20 and N21 is turned off and one of the transistors N22 and N23 is turned off to electrically disconnect the IO and the BL.

Although not shown, the column selection unit further includes a second circuit that has the same construction as the circuit that controls the connection between the IO line and the BL. The second circuit receives the same global column selection signals and controls connection between a complementary IO line (/IO) and a complimentary bit line (/BL). Accordingly, the column selection unit is capable of transmitting data from the BL and to the IO line and /IO line at the speed of the second frequency.

Figure 7:
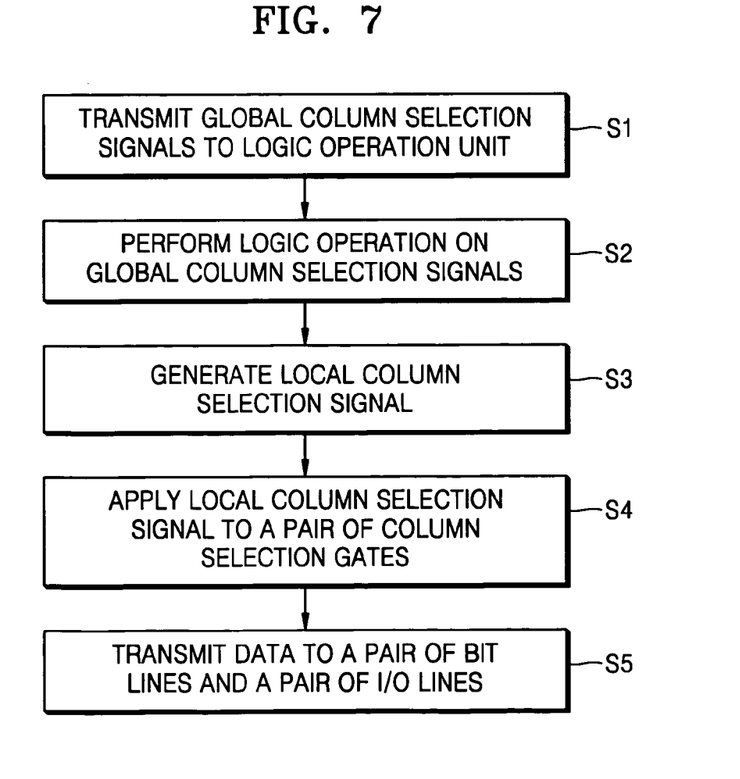
FIG. 7 is a flowchart illustrating a method of driving a semiconductor memory device according to an exemplary embodiment of the present invention.

FIG. 7 is a flowchart illustrating a method of driving a semiconductor memory device according to an exemplary embodiment of the present invention. Referring to FIG. 7, a plurality of global column selection signals are input via a plurality of global column selection lines to select a column of a memory cell array (S1). The global column selection signals have a first frequency that is lower than that of a reference clock signal, and are out of phase with one another by a predetermined angle.

The global column selection signals are transmitted to a logic operation unit, and a logic operation is performed thereon (S2).

Next, a local column selection signal is generated as the operation result (S3). The local column selection signal has a second frequency that is higher than the first frequency.

The generated local column selection signal is applied to a pair of column selection gates (S4) for controlling connection between a pair of bit lines and a pair of I/O lines (S5).

As described above, the plurality of the global column selection lines may comprise a first global column selection line and a second global column selection line. The logic operation may be a NOR operation, the first frequency may be half the frequency of a reference clock signal, and the difference in phase between first and second global column selection signals may be half a cycle of the reference clock signal.

In a semiconductor memory device according to an exemplary embodiment of the present invention, even if a global column selection signal is input via a global column selection line on which a load is applied, it is possible to stably toggle the global column selection signal, thereby improving the high-speed performance of the semiconductor memory device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device which receives and outputs data in synchronization with a reference clock signal, comprising:
  a memory cell array;
  a first global column selection line and a second global column selection line via which a first global column selection signal and a second global column selection signal are respectively transmitted to select a column of the memory cell array, the first and second global column selection signals having a first frequency lower than the reference clock signal frequency, wherein the first global column selection signal is out of phase with the second global column selection signal;
  a pair of column selection gates connected between a pair of bit lines and a pair of input/output lines, wherein gate terminals of the column selection gates are connected to a local column selection line; and
  a logic operation unit performing a logic operation on the first and second global column selection signals and outputting a local column selection signal, the local column selection signal having a second frequency higher than the first frequency,
  wherein the local column selection signal is applied to the gate terminals of the column selection gates via the local column selection line.

2. The semiconductor memory device of claim 1, wherein the logic operation unit comprises an exclusive NOR gate performing an exclusive NOR operation on the first global and second global column selection signals.

3. The semiconductor memory device of claim 2, further comprising a column selection line driver connected to the first and second global column selection lines, the column selection line driver generating the first and second global column selection signals.

4. The semiconductor memory device of claim 3, wherein the first frequency is half the reference clock signal frequency.

5. The semiconductor memory device of claim 4, wherein a difference in phase between the first and second global column selection signals is half a cycle of the reference clock signal.

6. The semiconductor memory device of claim 1, wherein the first and second global column selection lines are formed of different metal layers, respectively.

7. A semiconductor memory device which receives and outputs data in synchronization with a reference clock signal, comprising:
  a memory cell array;
  a plurality of global column selection lines via which a plurality of global column selection signals are respectively transmitted to select a column of the memory cell array, wherein the global column selection signals are out of phase with one another and have a first frequency lower than the reference clock signal frequency; and
  a column selection unit connected between a pair of bit lines and a pair of input/output lines, the column selection unit controlling transmission of data between the bit lines and the input/output lines in response to the global column selection signals at a second frequency higher than the first frequency.

8. The semiconductor memory device of claim 7, further comprising a column selection line driver connected to the global column selection lines, the column selection line driver generating the global column selection signals.

9. The semiconductor memory device of claim 8, wherein the global column selection lines comprise:
  a first global column selection line via which a first global column selection signal is transmitted; and
  a second global column selection line via which a second global column selection signal is transmitted.

10. The semiconductor memory device of claim 9, wherein the column selection unit controls transmission of data between the bit lines and the input/output lines according to an exclusive NOR operation performed on the first and second global column selection signals.

11. The semiconductor memory device of claim 10, wherein the first frequency is half of the reference clock signal frequency.

12. The semiconductor memory device of claim 11, wherein the difference in phase between the first and second global column selection signals is half a cycle of the reference clock signal.

13. The semiconductor memory device of claim 7, wherein the global column selection lines are formed of different metal layers, respectively.

14. A method of driving a semiconductor memory device which has a memory cell array and receives and outputs data in response to a reference clock signal, the method comprising:
  respectively transmitting global column selection signals via a plurality of global column selection lines to select a column of the memory cell array, wherein the global column selection signals are out of phase with one another and have a first frequency lower than the reference clock signal frequency;
  receiving the global column selection signals and performing a logic operation on the global column selection signals;
  outputting a local column selection signal to a pair of column selection gates, the local column selection signal generated by performing the logic operation on the global column selection signals, the local column selection signal having a second frequency higher than the first frequency; and
  controlling transmission of data between a pair of bit lines and a pair of input/output lines, in response to the local column selection signal.

15. The method of claim 14, wherein a first global column selection signal and a second global column selection signal are respectively transmitted via a first global column selection line and a second global column selection line.

16. The method of claim 15, wherein performing the logic operation comprises performing an exclusive NOR operation on the first and second global column selection signals.

17. The method of claim 16, wherein the first frequency is half the reference clock signal frequency.

18. The method of claim 17, wherein the difference in phase between the first and second global column selection signals is half a cycle of the reference clock signal.

* * * * *